United States Patent [19]

Chu et al.

[11] Patent Number: 5,253,053
[45] Date of Patent: Oct. 12, 1993

[54] VARIABLE LENGTH DECODING USING LOOKUP TABLES

[75] Inventors: Ke-Chiang Chu, Saratoga; James O. Normile, Sunnyvale; Chia L. Yeh, Saratoga; Daniel W. Wright, Sunnyvale, all of Calif.

[73] Assignee: Apple Computer, Inc., Cupertino, Calif.

[21] Appl. No.: 636,498

[22] Filed: Dec. 31, 1990

[51] Int. Cl.⁵ .................................................. H04N 7/12
[52] U.S. Cl. ........................................ 358/133; 382/56
[58] Field of Search ............................ 358/133; 382/56

[56] References Cited

U.S. PATENT DOCUMENTS

| | | | |
|---|---|---|---|
| 4,845,559 | 7/1989 | Labit et al. | 358/133 |
| 4,922,508 | 5/1990 | Moriya | 358/133 |
| 4,933,762 | 6/1990 | Guichard et al. | 358/133 |
| 4,963,030 | 10/1990 | Makur | 358/133 |
| 5,068,723 | 11/1991 | Dixit et al. | 358/133 |

Primary Examiner—John K. Peng
Attorney, Agent, or Firm—Blakely, Sokoloff, Taylor & Zafman

[57] ABSTRACT

A method and apparatus for decoding a variable length codeword (VLC) by reading a VLC, the VLC having a maximum length of X bits. The VLC is used as an index into a first table, wherein the first table contains decoded values for all possible VLC's with Y bits not equal to any value in a first set of values. Y is typically less than X and comprises, in the preferred embodiment, the most significant bits of the VLC. If the first Y bits of the VLC are not equal to any value in a first set of values then a second value is returned from the first table. If the first Y bits of the VLC are equal to any value in a first set of values, then a pointer to a second table is returned from the first table. The VLC is used as an index into the second table, and a third value is returned from the second table.

26 Claims, 11 Drawing Sheets

VARIABLE LENGTH DECODING USING LOOKUP TABLES

BACKGROUND OF THE INVENTION

1. Field of the Invention

This invention relates to the field of variable-length decoding on computer systems. More particularly, this invention relates to a scheme for variable-length decoding using lookup tables on a computer system.

2. Background Information

Recently, demands for full motion video in such applications as video telephony, video conferencing, and/or multimedia applications have required that standards be introduced for motion video on computer systems. Such applications have required that development of compression techniques which can reproduce the amount of data required to represent a moving images along with the corresponding sound to manageable lengths which may be transmitted using current communications hardware. These compression techniques typically use Huffman encoding. One standard using Huffman encoding for compression of video data is known as the Joint Photographer Experts Group (JPEG) standard. A standard using Huffman encoding for full motion video applications, typically used in video conferencing or video telephony applications, is known as the CCITT standard which provides non-broadcast quality images. This standard is useful for basic video teleconferencing and video telephony as well as some multimedia activities on computer systems. This standard also greatly reduces the amount of bandwidth required for transmitting motion video images.

Another standard using Huffman encoding for compression of motion picture video images for transmission or storage is known as the Motion Picture Experts Group (MPEG) standard. Again, as in the other two systems discussed above, the MPEG standard allows full motion video images to be transmitted at rates up to 30 frames per second (fps). MPEG allows motion picture video to be compressed along with the corresponding high quality sound, and provides other features such as single frame advance, reverse motion, and still frame video as well. In contrast, the CCITT standard simply allows forward motion viewing only and has no provisions for slow motion, reverse or single frame advance as in MPEG. Also, CCITT provides a lower quality image than MPEG.

Both MPEG and CCITT encode a given image of a frame by breaking up the image into distinct areas, sampling data from those areas, and representing each area in a coded form. This information is coded by the transmitting device, and is decoded by the receiving device, allowing transmission of full motion video. Alternatively, the coded video data may be stored in computer main memory, or nonvolatile storage media such as hard disk drives, optical disk drives, or tape for later viewing of the full motion video images.

In order to exploit statistical redundancies in video imagery, standards such as CCITT and MPEG use a technique in one of its coding layers known as variable length coding. Variable length codewords (VLC's) used in variable length coding are encoded and decoded by a device known as a video coder/decoder (codec) which is shown and discussed with reference to FIG. 1.

As shown in FIG. 1, 100 is a vide codec which may be used for encoding/decoding video data in a prior art system. FIG. 1 is shown in a simplified block diagram form to assist the understanding of the reader. As shown in FIG. 1, codec 100 comprises two distinct sections: Video coder 110; and video decoder 150. Video coder 110 comprises a coding control unit 111 which provides control and synchronization of information which is fed into video coder 110. Video coder 110 and video decoder 150 perform sampling at specific multiples of the video line rate of the incoming signal 130. Input data 130 and output data 170 is received/transmitted at a rate of approximately 40 kilobits or 2 megabits per second. Signals 130 and 170 are in CCIR 601 format for either SIF 525 (525 line display format, the North American Standard), or SIF 625 (for 625 line formats). Coding control 111 controls source coder 112 which encodes input signal 130 which is input in CCIR 601 format to source coder 112. Source coder 112 and video multiplex coder 113 convert the CCIR 601 signal 130 to the CCITT or MPEG standards, for example. Video multiplex coder 113 encodes information in the output signal 120 to represent certain types of information indicating the type of display format which is used, whether the image has moved, and other information. Multiplex coder 113 handles these various layers of information which is encoded in the transmitted image(s). Information is passed by the multiplex coder 113 to the transmission buffer 114 in coder 110 to hold data until such time as transmission coder 115 requires the information and transmits it as signal 120. As is shown in FIG. 1, transmission buffer 114 gives feedback to coding control 111 to notify when a full image or set of images is residing in transmission buffer 114 and the information is ready for transmission coder 115. Transmission coder 115 appends header information to the data, which is transmitted first in stream 120, to indicate the destination device or other information for data 120 being transmitted.

The second half of video codec 100 is video decoder 150. Video decoder 150 accepts coded bit streams 160 such as those generated by a coder such as section 110 in FIG. 1. Video decoder 150 decodes the signal to display the image in CCIR 601 format as signal 170 for display. Coded information 160 is received and accepted by transmission decoder 154 if the device containing codec 100 is the appropriate receiving device. This information is then passed along to receiving buffer 153 which holds the image(s) until such time as video multiplex coder 152 is ready to decode the layers of information. As discussed with regard to video multiplex coder 113 in coder section 110, video multiplex decoder 152 strips information off layer by layer in the signal in the incoming data signal 160. Then, this information is passed to source decoder 151 which will convert the coded bit stream to the appropriate CCIR 601 format as signal 170 for display. Although video codec 100 is typically used in video telephony applications, such a device may be used, without the use of, transmission coder 115 and transmission decoder 154 if the unit is used in another application such as multimedia. Therefore, this type of unit will only include circuitry for encoding/decoding only, and not transmission/reception. External control of unit 100 is accomplished via a central processing unit or other similar circuitry.

Because the information received by decoder 150 in FIG. 1 are variable length codewords (their length is not constant for different values), the video multiplex decoder 152 must have a means for converting every possible VLC which is received in signal 170. Prior art video multiplex decoders such as 152, perform decoding using a single lookup table for all of the possible VLC's to generate CCIR 601 values for the properly decoded signal 170. Because these VLC's may sometimes range from 0 bits in length (for no signal) to 14 bits in length, video multiplex decoder 152 requires a lookup table containing entries for the maximum possible length of the incoming VLC's. For VLC's which may range up to 14 bits in length for CCITT and MPEG standards, this table will require approximately $2^{14}$ or a total of 16,384 entries. Because numerous VLC's are encoded in the incoming bit streams, a video multiplex decoder such as 152 requires a separate lookup table for each of these VLC's which may be seen by the decoder. (For instance, if 10 lookup tables are required for VLC's which are up to 14 bits in length, then the storage required by video multiplex decoder 152 is approximately 160,000 total entries in the tables.) As can be appreciated, a vast amount of storage is required by prior art multiplex decoder 152.

Another problem arises because the incoming bit stream must be decoded in real-time systems within a finite period of time, and lookups into these very large tables may impede performance. In a non real-time situation, this poses no problem since images may be decoded at leisure. However, in real time applications such as video telephony or multimedia applications, the high rate of speed at which data is incoming, in addition to the requirement that video be available at a certain rate (29.97 Hz or approximately 30 fps in some applications) requires that a video multiplex decoder perform decoding and other calculations within a finite amount of time. Therefore, in some prior art systems, digital signal processors have been used by decoder 150. These enable the images from the encoded incoming bit stream to be decoded and available for display in real-time. The cost of video multiplex decoder 150 is thus increased due to the use of expensive components such as math co-processors or digital signal processors in addition to the increased memory and performance penalties associated with large lookup tables. Therefore, due to the increased use of real time video in video telephony, multimedia, and other modern applications, less expensive and more efficient solutions for decoding video data are desired.

SUMMARY AND OBJECTS OF THE INVENTION

One of the objects of the present invention is to provide an inexpensive means for providing real time decoding of variable length data.

Another object of the present invention is to find more efficient solution for real time variable length decoding.

These and other objects are provided for by a method and apparatus for decoding a variable length codeword (VLC) by reading a VLC, the VLC having a maximum length of X bits. In a preferred embodiment, the VLC is encoded using Huffman-type encoding and is used in either MPEG (Motion Picture Experts Group), CCITT, or JPEG (Joint Photographer's Experts Group) standards for video compression. Alternatively, the VLC may be used for encoding audio or other types of data. The VLC is used as an index into a first table, wherein the first table contains decoded values for all possible VLC's with first Y bits not equal to any values in first set of values. This table is known, in the preferred embodiment, as a "frequent" table because VLC's for which it returns decoded values are typically the most frequently occurring bit patterns. Y is typically less than X and comprises, in the preferred embodiment, the most significant bitds of the VLC. If the first Y bits of the VLC are not equal to any value in a first set of values then a second value is returned from the first or "frequent" table. If the first Y bits of the VLC are equal to the first value, then a pointer to a second table is returned from the first table. The second table is known, in the preferred embodiment, as an "infrequent" table because the bit patterns for which it generates decoded values occur less frequently than those in the first table. The VLC is used as an index into the second table, and a third value is returned from the second table. This value, in the preferred embodiment, is the decoded value. Although this describes a two-stage table-lookup is described, this idea can be extended to any number of stages of lookup tables, as required. This invention takes advantage of the fact that there is not a decoded value for every possible bit pattern having the maximum possible length of the VLC. For example, in a prior art single lookup table or content addressable memory approach to decoding VLC's, these VLC's having a maximum possible length of 14 bits, the lookup table or content addressable memory has $2^{14}$ or 16,384 entries. In a preferred embodiment, using a two-stage lookup table approach, two separate lookup tables containing $2^8$ or 256 entries each are required, for a total of 512 entries. In this example, a memory savings by a factor of 32 is achieved, along with the performance increase attained by having to address smaller lookup tables. Memory savings increases exponentially as the maximum length of the VLC and the number of lookup tables increases. This is especially useful, in a preferred embodiment, in real-time video decoding applications.

DETAILED DESCRIPTION OF THE PREFERRED EMBODIMENT

The present invention covers a method and apparatus for variable length decoding using lookup tables. In the following description for the purposes of explanation, specific values, signals, coding formats and input formats are set forth in order to provide a thorough understanding of the present invention. It will be apparent, however, to one skilled in the art, that the present invention may be practiced without these specific details. In other instances, well known circuits and devices are shown in block diagram form in order to not unnecessarily obscure the present invention.

Figure 2:
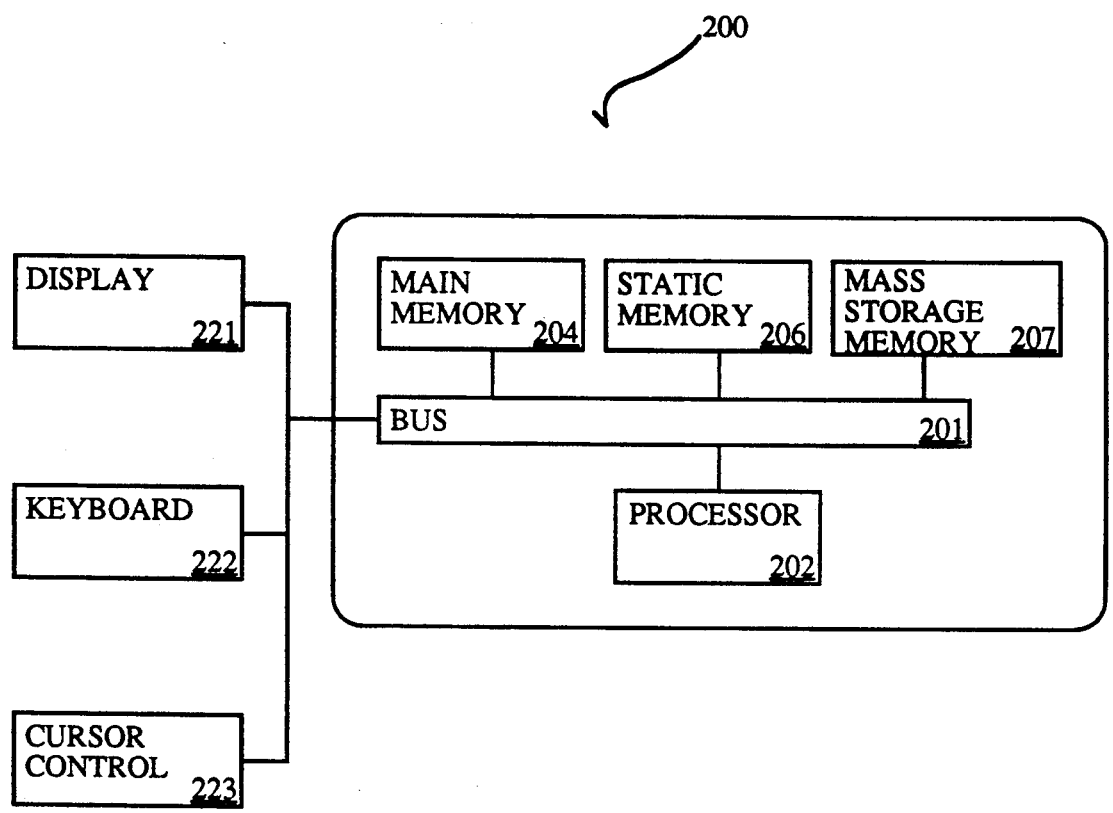
FIG. 2 shows a computer system used in the preferred embodiment.

Referring to FIG. 2, the computer system upon which the preferred embodiment of the present invention is implemented is shown as 200. 200 comprises a bus or other communication means 201 for communicating information, a processing means 202 coupled with bus 201 for processing information, a random access memory (RAM) or other dynamic storage device 204 (referred to as main memory) coupled to bus 201 for storing information and instructions for processor 202. Computer system 200 also comprises a read only memory (ROM) and/or other static storage device 206 coupled to bus 201 for storing static information and instructions for the processor 202, a data storage device 207 such as magnetic disk or optical disk and corresponding disk drive, coupled to bus 201 for storing information and instructions. Computer system 200 further comprises a display device 221, such as a cathode ray tube (CRT), coupled to bus 201 for displaying information to the computer user, an alpha-numeric input device 222, including alpha-numeric and other keys, coupled to bus 201 for communicating information and command selections to processor 202, and cursor control device 223, such as a mouse, a trackball, or cursor direction keys, coupled to bus 201 for communicating direction information and command selections to processor 202 and for controlling cursor movement.

In the preferred embodiment, computer system 200 is one of the Macintosh family of personal computers, such as the Macintosh SE or Macintosh II manufactured by Apple Computer, Inc. of Cupertion, Calif. Processor 202 is one of the 68000 family of microprocessors manufactured by Motorola, Inc. of Shaumburg, Ill.

Figure 1:
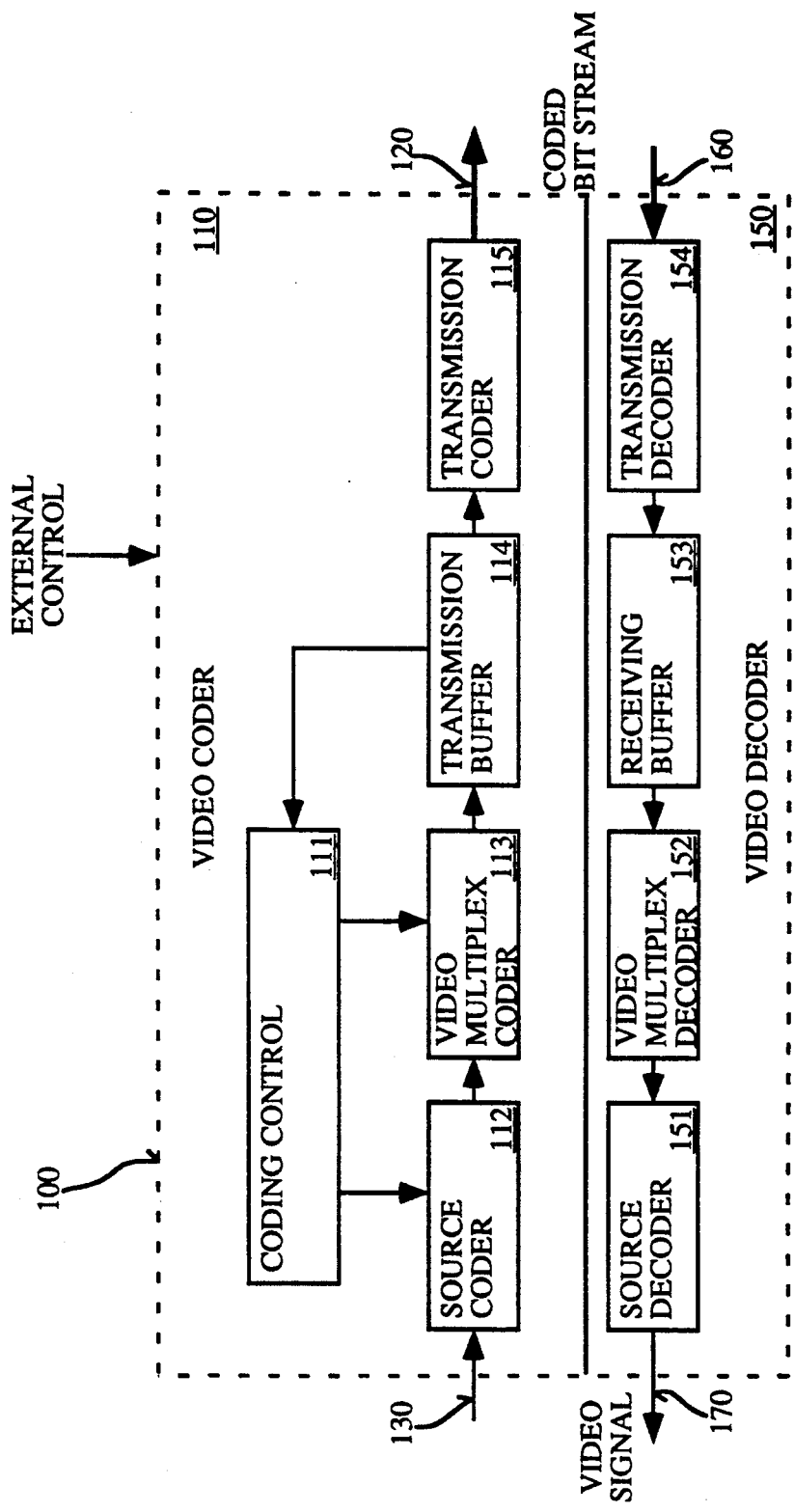
FIG. 1 shows a prior art video codec.

Computer system 200 shown in FIG. 2 is used for the major portions of the video codec 100 shown in FIG. 1. The preferred embodiment may be implemented in either hardware (discrete circuitry or firmware, for instance) or software in computer system 200.

Figure 3A:
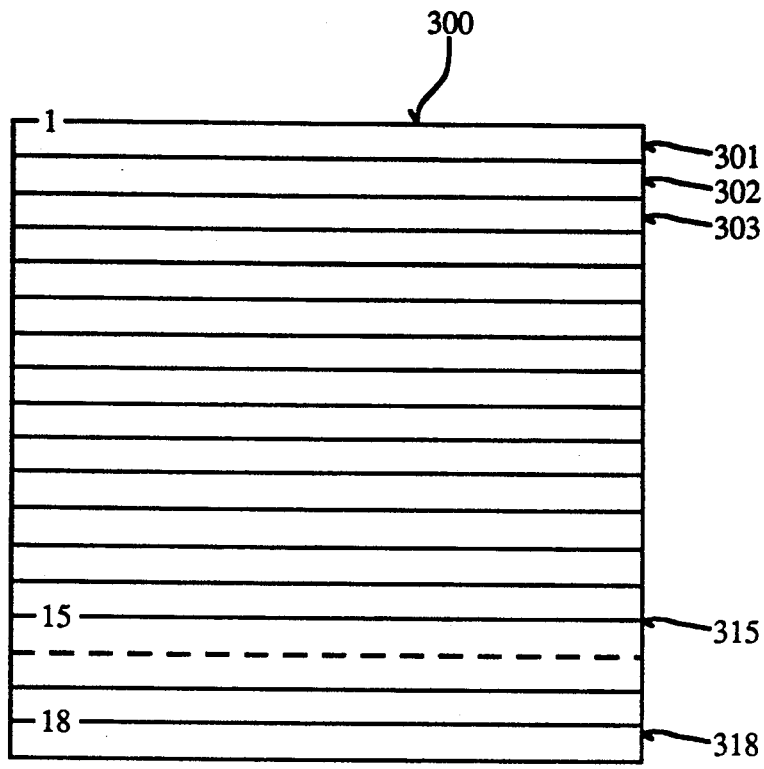
FIG. 3a shows the arrangement of macroblock slices for encoding a picture.

One scheme of breaking down a particular image and encoding it is shown and discussed with reference to FIGS. 3a through 3e. The scheme which will be discussed here is currently part of the MPEG standard. Although this discussion will focus on the MPEG standard, the techniques and concepts used have analogs in the CCITT, JPEG standards, or any other technique using VLC's, and the preferred embodiment has equal application in those areas. Therefore, this discussion cannot be viewed as limiting the scope of the present invention. As shown in FIG. 3a, a particular video image 300 may be broken into a series of horizontal slices such as 301 through 318 shown in FIG. 3a. As shown in FIG. 3a, a particular slice 301, of the video image 300 is known as a macroblock slice. In North America, video image 300 has a horizontal resolution of approximately 525 lines. This standard is known as SIF 525, and comprises fifteen macroblock slices 301 through 315 as shown in FIG. 3a. In Europe and various other parts of the world, the SIF 625 standard is used, which has approximately 625 lines of horizontal resolution and extends to slice 318 as shown in FIG. 3a. Each macroblock slice, such as 301 shown in FIG. 3a, is broken into a series of macroblocks which is discussed and shown with reference to FIG. 3b.

Figure 3B:
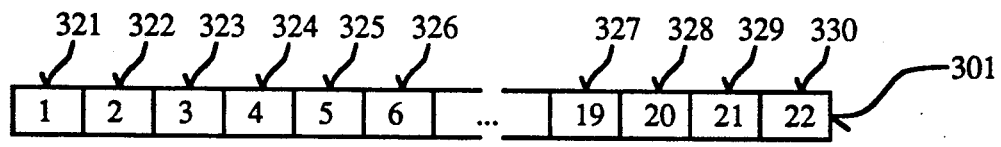
FIG. 3b shows the structure of a macroblock slice.
Figure 3C:
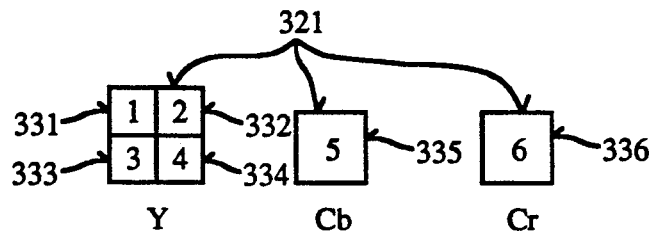
FIG. 3c shows the structure of a macroblock.

FIG. 3b shows one particular macroblock slice 301 which has been divided into 22 horizontal macroblocks 321 through 330 as shown in FIG. 3b. Further, each macroblock, such as 321 in FIG. 3b, is divided into six distinct blocks as shown in FIG. 3c which represent given attributes of the macroblock. FIG. 3c shows 321 divided into 331 through 334 which represents Y or the luminance for a particular macroblock which is sampled in a given image. Further, the macroblock comprises two additional blocks 335 and 336 which represent the chrominance level for blue (Cb) and the chrominance level for red (Cr), respectively. 335 and 336 represent the overall chrominance for the blue and red colors for the entire macroblock area, which is generated by sampling the image using a horizontal and vertical decimation filter. Each of the blocks gives the particular luminance and chrominance values for the macroblock. This is determined by sampling odd fields in the scan lines of the image, generating overall luminance and chrominance values for the sampled area. These blocks are present in the macroblock in the sequential order: 331, 332, 333, 334, 335 and 336.

Figure 3D:
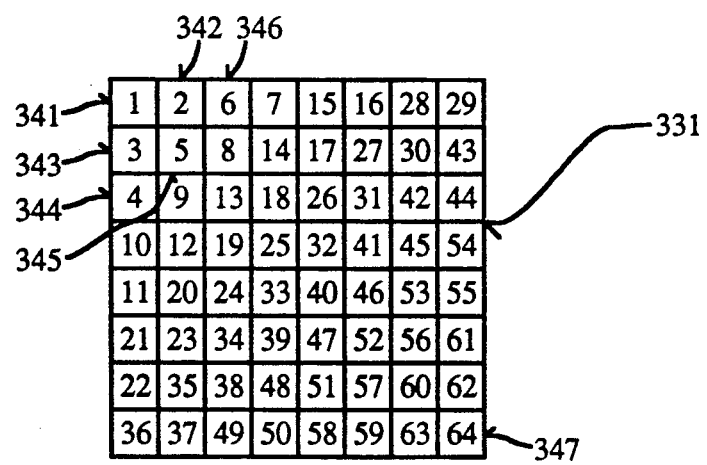
FIG. 3d shows the structure of a block.

Each block, such as 331 through 336 as shown in FIG. 3c, is divided into groups of eight by eight pixels. One particular block, which may be a luminance block such as 331, or a chrominance block such as 335 or 336 is shown in FIG. 3d. As shown in FIG. 3d, luminance block 331 is eight by eight pixels in size, and each pixel is scanned in a diagonal zigzag pattern. In other words, the first pixel of block 331 is pixel 341 which is the upper left most pixel in block 331. The next addressed pixel is block 342 which is the next right pixel to 341, and then the following scanned pixel is pixel 343 which is the next pixel to the left and down from pixel 342. Then, 344 may be addressed which is the next pixel down from 343, and 345 is addressed which is the next pixel to the right and up from pixel 344. The scanned pixel after that is 346 shown in FIG. 3d. All of the pixels are addressed in this manner until the entire block has been sampled at the right and lower most pixel 347 shown in FIG. 3d. The chrominance and luminance samples of each block are such that there are four luminance samples for every chrominance sample. The two chrominance samples overlap one another and represent the blue chrominance value Cb 335 and the red chrominance value Cr 336 of the surrounding pixels. The arrangement of samples for given images is illustrated in FIG. 3e.

Figure 3E:
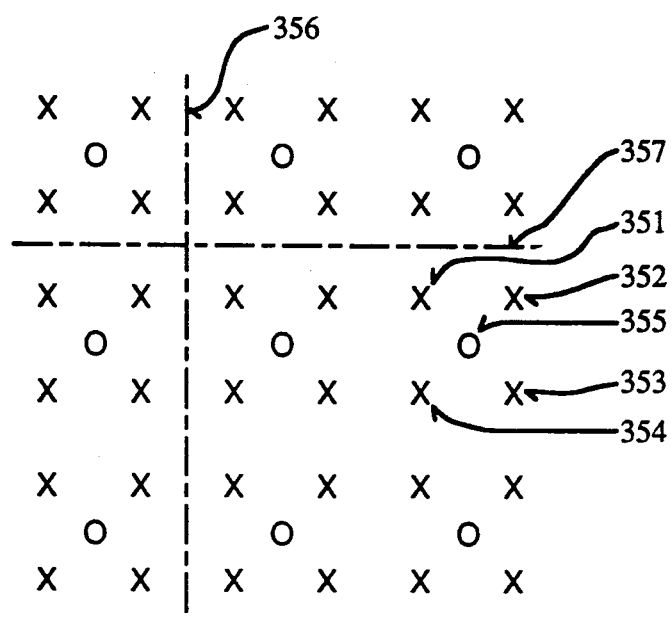
FIG. 3e shows the positioning of luminance and chrominance samples which is used for generating macroblocks in the preferred embodiment.

As is shown in FIG. 3e, there are four luminance samples per block such as 351, 352, 353 and 354 for every chrominance sample such as 355 shown in FIG. 3e. Therefore, using this scheme, an image represented in CCIR 601 format to the SIF 525 or SIF 625 formats may be sampled for pixels within each block boundary such as 356 and 357. This generates appropriate chrominance and luminance values for the block as a whole for encoding.

Figure 4:
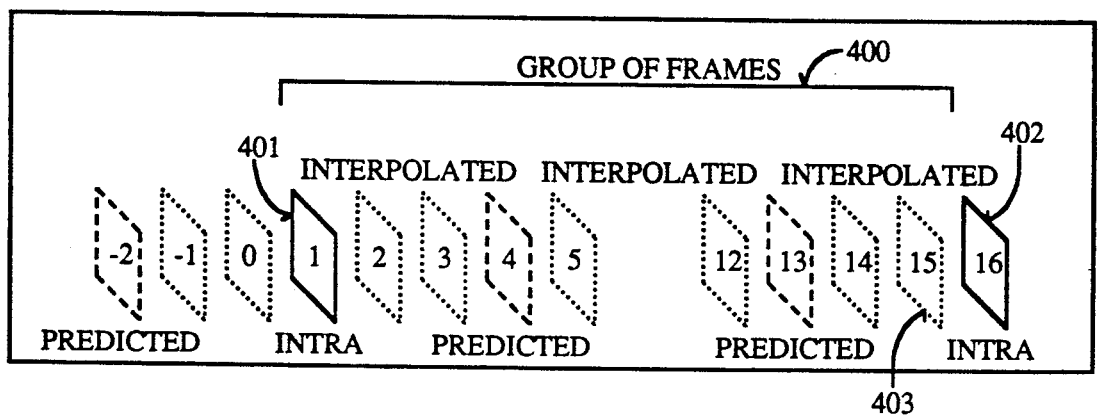
FIG. 4 shows the structure of a group of frames in the preferred embodiment.

Although the MPEG standard is not fully finalized, the preferred embodiment uses the tentative MPEG standard as an example of describing how multiple stage VLC lookup table decoding is accomplished. In MPEG, encoding is performed on a series of motion video images in a hierarchical format. The highest level of these layers is known as the Group of Frames (GOF) layer. The next layer is the Picture layer. Each GOF consists of a number of consecutive frames (at the picture layer) beginning with an "intra" frame and ending with a frame prior to the next "intra" frame in the bit stream the decoder receives. An example of a group of frames is shown in FIG. 4 as 400. GOF 400 is all the frames from intra frame 401 to the frame 403 before the next intra frame 402. Alternatively, a group of frames can be a number of consecutive frames, the number being one or more. The number will be specified in a data field of the incoming bit stream in a manner to be discussed below. The frames may be "interpolated" or "predicted" frames in MPEG in the GOF. Prior to receiving each GOF such as 400, certain header information is transmitted accompanying the data. This information is transmitted at the GOF layer and will now be discussed.

As discussed above in MPEG, motion picture images are encoded in a hierarchical structure within data. This structure is done in layers as follows:

1) Group of frame (GOF) layer;
2) Picture layer;
3) Macroblock slice (MB slice) layer;
4) Macroblock (MB) layer; and
5) Block layer.

Figure 5:
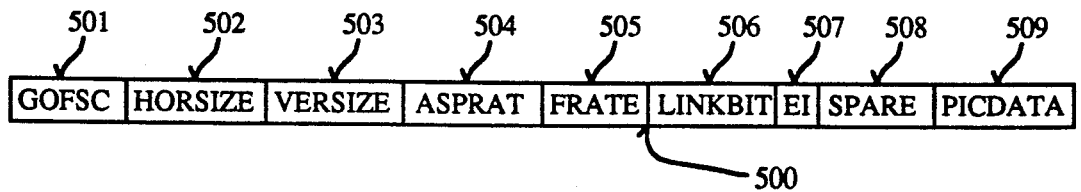
FIG. 5 shows the structure of a group of frames layer.

Data for one of the succeeding layers occupies fields in a datum of the previous layer. As shown in FIG. 5, the GOF layer is in a format as defined by 500. As shown in FIG. 5, GOF 500 starts with a group of frames start code (GOFSC) 501 which is 24 bits in length. This indicates that a group of frames is about to be received by the multiplex decoder. The value contained in each GOFSC 501 is 0000 0000 0000 0001 1111 1111. Following GOFSC 501 is the horizontal picture size (HORSIZE) data field 502. This field is 12 bits in length and ranges between the values 1 and 3968. The next field is vertical size field (VERSIZE) 503. This field is also 12 bits in length and ranges between the values 1 and 4095. The next field 504 is used for storing the pixel aspect ratio and is known as ASPRAT 504. ASPRAT 504 is represented as a 4 bit number with each aspect ratio indicated by the following codes in table 1:

TABLE 1

| Pixel Aspect Ratio (ASPRAT) 4 bits | |
|---|---|
| Height/width | Code |
| Reserved | 0000 |
| 1 | 0001 |
| CCIR 601, 525 line | 0010 |
| CCIR 601, 625 line | 0011 |
| Reserved | 0100 |
| . | . |
| . | . |
| . | . |
| Reserved | 1111 |

The next field in 500 is FRATE 505 which indicates the frame rate of GOF 500 in frames (fps) of cycles per second (Hz). Frame rates are indicated by the following codes in table 2:

TABLE 2

| Frame Rate (FRATE) 4 bits | |
|---|---|
| Framerate | Code |
| Reserved | 0000 |
| 24 Hz | 0001 |
| 25 Hz | 0010 |
| 29.97 Hz | 0011 |
| 30 Hz | 0100 |
| Reserved | 0101 |
| . | . |
| . | . |
| . | . |
| Reserved | 1111 |

The next field in data packet 500 is link bit 506. This is a one bit flag which is normally set to 0. It is set to 1 by editors to indicate that the group of frames preceding this group of frames has been changed. If this is the case, any bidirectionally predictive-coded frames immediately following the "intra" coded frame should be discarded. The next field is the extra insertion information (EI) bit 507. 507 indicates the presence of a data field 508 which follows this field. If this flag is set to 0, then GOF 500 does not contain spare field 508. If, however, EI bit 507 is set to 1, spare field 508 is present in GOF 500. Spare field 508 is used to indicate backward compatible editions to the MPEG specification which currently in use. At present, this field is not defined. Spare information will contain a multiple of 8 bits of data and may contain multiple extra insertion information and spare information. A first spare information is present if the EI bit 507 is set to 1. Then, 508 may contain another extra insertion bit after the spare data, and additional spare information if there is another EI bit following that. This may continue, for as many EI's and spare information as is present in GOF 500. Finally, the remainder of GOF 509 contains picture data to define a moving image. This information will be contained at the picture layer which is now be discussed.

Figure 6:
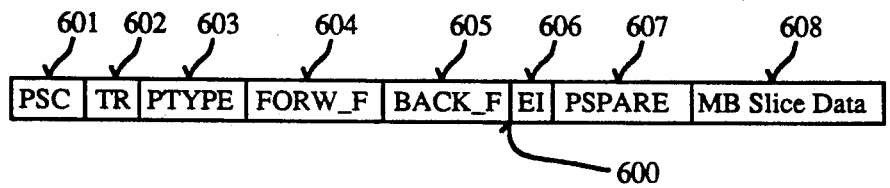
FIG. 6 shows the structure of a picture layer.

Contained in field 509 of 500 are multiple the picture data such as 600 shown in FIG. 6. Each picture datum such as 600 contained within 509 starts with a picture start code (PSC) 601. This field is 24 bits in length and contains the value 0000 0000 0000 0001 0000 0000. PSC 601 indicates to the multiplexing circuitry the start of a picture. Following PSC field 601 is a temporal reference (TR) field 602 which is 5 bits in length. The 5 bit number is formed by incrementing its value in the previous picture header of GOF 500 by 1. The initial picture in a group of frames will contain 0 in TR field 602. Arithmetic used for TR field 602 is done with modulo 32 arithmetic. So, if the previous picture header was equal to 31, the next picture header will have its TR field 602 containing 0.

The next field in the picture datum 600 is the P frame type (PTYPE) field 603. This field is 2 bits in length and is encoded with the following values in table 3 to indicate the type of frame that the picture datum contains:

TABLE 3

| Frame Type Information (PTYPE) 2 bits Information about the complete picture: | |
|---|---|
| Frametype | Code |
| Forbidden | 00 |
| Intra Frame | 01 |
| Predicted Frame | 10 |
| Interpolated Frame | 11 |

The next two fields in the picture datum 600 are the forward frame field 604 and the backwards frame field 605. These fields are used for addressing the next frame and the previous frame to the current frame in the GOF. This indirection allows for forward and backward motion motion picture images on a display screen in MPEG. Because CCITT does not allow backward motion, a corresponding field in that standard does not exist.

The next two fields in datum 600 are the extra insertion information (EI) 606 and the PSPARE information 607. As discussed with reference to fields 507 and 508 in FIG. 5, EI 606 contains 0 if there is no spare information field 607, and it contains a 1 if spare information 607 is present. Picture spare information 607 is also used for backward compatibility of picture data such as 600 shown in FIG. 6. Again, as with 507 and 508 discussed above, 607 may contain additional spare information if the first bit in each group of 9 bits is set to 1. This indicates that another 8 bits follow that flag bit indicating spare information is present. This continues until there is no longer any spare information as indicated by an EI bit containing 0. Finally, the picture layer packet 600 contains the macroblock (MB) slice data 608 which is now discussed.

Figure 7:
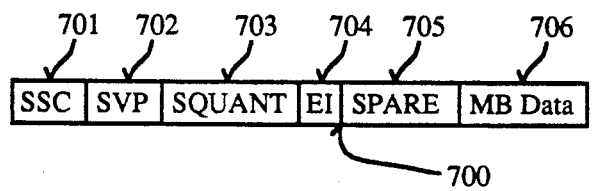
FIG. 7 shows the structure of a macroblock slices layer.

A macroblock slice, many of which are contained in field 608 of datum 600, is shown in FIG. 7 is 700. As discussed previously, each frame is divided into macroblock slices (MBS's), each consisting of a series of macroblocks in left to right and top to bottom order within a frame. The number of macroblocks in an MBS is variable. Slices in one frame need not be the same as slices in other frames. Slices can begin and end at any macroblock in the frame, not necessarily the left and right edges of the image. A slice can continue from one row of macroblocks to the next. The minimum number of slices in a frame is one. Although, as discussed above, there are specific numbers of macroblock slices as determined by the input coding information which is contained in field 504 of GOF 500 shown in FIG. 5. As discussed above, for SIF 525 format, the image will contain 15 MBS's. For the SIF 625 line format, the image will contain 18 MBS's. MBS 700 starts with a slice start code (SSC) 701 indicating the start of the macroblock slice. This is a 16 bit word with the value 0000 0000 0000 0001. SSC 701 indicates the beginning of each MBS 700. The next field in MBS 700 is the slice vertical position (SVP) field 702. This field indicates the vertical position in macroblock units (a maximum of 15 in SIF 525 or 18 in SIF 625) of the first non-fixed macroblock in the slice. Coding is natural binary, and the field is 8 bits in length. The first position, therefore, is 0000 0001. It is possible for two or more MBS' to have a common SVP and gaps may be present in the SVP numbers indicated in field 702.

The next field in MBS 700 is a quantization parameter (SQUANT) 703 which is 5 bits in length. This fixed length code word provides the value indicating the quantization parameter to be used in the group of blocks until overridden by any subsequent MQUANT. The significance of this particular value is outside the scope of the present invention and, therefore, is not more completely discussed. Further, extra insertion (EI) information is present in field 704, and 705 is present if the one bit EI information 704 contains 1. If EI 704 contains 0, field 705 is not present. As discussed with the previous layers of the picture, spare field 705 may contain other flags for EI information, and if so, then an additional 8 bits followed each EI value containing 1. Again, as in the layers discussed above, the EI and SPARE information fields 704 and 705 provides additional data fields for future compatible editions to MPEG. Finally, macroblock data is contained in field 706 shown in FIG. 7. Each macroblock slice contains 22 macroblocks in field 706. A macroblocks is discussed and shown with reference to FIG. 8.

Figure 8:
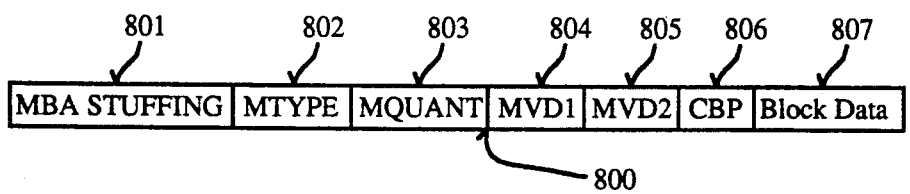
FIG. 8 shows the structure of a macroblock layer.

As shown in FIG. 8, one macroblock (MB) of which many may be present in field 706 of the macroblock slice 700 is shown as 800. The first field in MB 800 is known as the macroblock addressing (MBA) field 801. MBA is a relative addressing scheme used to implement variable length code words (VLC's) for macroblocks which may or may not have changed since the last frame in the GOF. This scheme will be discussed in more detail below, but it should be appreciated that MBA 801 is a variable length field. Further, MB 800 contains a macroblock type (MTYPE) field 802 indicating intra, predicted, or interpolated macroblocks. As with field 801, this field is a VLC and will be discussed in more detail below. Further, macroblock 800 contains a quantizer field (MQUANT) 803 which is 5 bits in length. As with the SQUANT field 703 in MB slice 700 discussed above, this code word provides the value to be used for this and any subsequent blocks in the macroblock until overridden by a subsequent MQUANT value. The values used for this field are the same as used for SQUANT 703, discussed above.

The next two fields in MB 800 are motion vector data 1 (MVD1) 804 and motion vector data 2 (MVD2) 805. These two fields are also VLC's, and will be discussed in more detail below. Each of these fields is included for all macroblocks for predicted frames, and all non-intra macroblocks of interpolated frames. MVD2 805 is only included in the case of interpolative prediction. MVD1 804 and MVD2 805 consist of VLC's for the horizontal and vertical components of a particular MB 800. VLC's for these fields are discussed below in more detail. Each of the MVD's 804 and 805 represents a pair of difference values. Only one of the pair will yield a macroblock vector falling within a permitted range.

The next field in MB 800 is coded block pattern (CBP) field 806. This field is present if indicated by MTYPE 802. This code word gives a pattern number signifying those blocks in MB 800 for which at least one transform coefficient is transmitted. The pattern number contained in CBP field 806 is given by:

$$32*P_1 + 16*P_2 + 8*P_3 + 4*P_4 + 2*P_5 + P_6$$

where $P_N$ is 1 if any coefficient is present for block N, otherwise it is 0. Block numbering is discussed in more detail below. CBP 806 is not used in intra frames or intra macroblocks. Finally, the macroblock 800 will contain block data in field 807. This data will be discussed with reference to the block layer datum as shown in FIG. 9 below.

Figure 9:
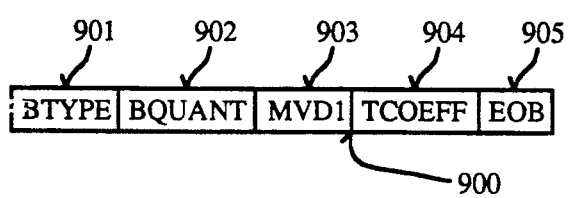
FIG. 9 shows the structure of a block layer.

As shown in FIG. 9, one block 900 of which many may be contained in field 807 is shown as 900 in FIG. 9. Each block contains a block type (BTYPE) field 901 which is only present if is indicated by the 8×8 macroblock mode, and if the corresponding block is coded and decoded as indicated by field 806 discussed above. Further, block 900 contains a B block quantizer (BQUANT) 902 which is 5 bits in length. This value is only present if it is indicated by BTYPE 901. This field provides the value of the quantizer to be used for this and any subsequent blocks in the group of blocks until overridden by any subsequent MQUANT or BQUANT. Further, block 900 comprises a field motion vector data 1 (MVD1) 903 which is only present when indicated by BTYPE field 901. MVD1 903 is included for all MB's of predicted frames and for all non-intra MB's of interpolated frames. MVD1 903 consists of a VLC for the horizontal component followed by a VLC for the vertical component. This is similar to the MVD1 and MVD2 fields 804 and 805 discussed with reference to FIG. 8. These VLC's are discussed in more detail below. Again, as with the MVD1 804 and MVD2 805 fields, the value contained in this field represents a pair of difference values. Only one of the pair will yield a macroblock vector falling within a permitted range.

Finally, block data 900 comprises a transform coefficients field (TCOEFF) 904 which includes transform coefficient data for all six blocks in a macroblock when MTYPE field 802 indicates that it is an "intra" macroblock. In other cases, the MB address field 801, MTYPE field 802, CBP field 806 and the 8×8 mode BTYPE field 901 signal which blocks have coefficient data transmitted for them. The block 900 terminates at end of block marker 905 which indicates the end of the block. This is a pattern "01", in EOB field 905 as shown in table 11.

A feature of the MPEG coding standard is that certain aspects of the transmitted group of frames data comprises variable length code word (VLC) information. VLC's are used to exploit statistical redundancies of the code words used for macroblocks used in MPEG encoded motion picture data. VLC's are also used (but not necessarily for the same fields) in CCITT and JPEG. Specific fields in the macroblocks are encoded using VLC's, and will now be discussed using their particular code words.

For MBA field 801 of macroblock datum 800, the macroblock address is a relative address which is used for coding macroblocks in all frames. Macroblocks for which no data is appended are run-length encoded using the macroblock address, and these macroblocks are called fixed. In intra frames, macroblocks are never not coded, although this mode is allowed. In predicted frames, a macroblock is fixed if its motion vector is 0 and all its quantized coefficients are 0. In interpolated frames, a macroblock is fixed if its motion vector is 0 and all its quantized coefficients are 0 as well. MBA 801 is a VLC indicating the position of a macroblock within a macroblock slice such as 700. The non-fixed order of macroblock slices is shown in FIG. 3a. For the first non-fixed macroblock 800 in a macroblock slice such as 700, MBA 701 contains the absolute address specified by the position of the macroblock slice in the frame, as indicated by its position on a frame such as 300 shown in FIG. 3a. For subsequent macroblocks, MBA 801 contains the difference between the absolute address of the macroblock, and the last transmitted macroblock. The code table for this macroblock address is as follows in table 4:

TABLE 4

| MBA | Macroblock Addressing Code |
|---|---|
| 1 | 1 |

TABLE 4-continued

| MBA | Macroblock Addressing Code |
|---|---|
| 2 | 011 |
| 3 | 010 |
| 4 | 0011 |
| 5 | 0010 |
| 6 | 0001 1 |
| 7 | 0001 0 |
| 8 | 0000 111 |
| 9 | 0000 110 |
| 10 | 0000 1011 |
| 11 | 0000 1010 |
| 12 | 0000 1001 |
| 13 | 0000 1000 |
| 14 | 0000 0111 |
| 15 | 0000 0110 |
| 16 | 0000 0101 11 |
| 17 | 0000 0101 10 |
| 18 | 0000 0101 01 |
| 19 | 0000 0101 00 |
| 20 | 0000 0100 11 |
| 21 | 0000 0100 10 |
| 22 | 0000 0100 011 |
| 23 | 0000 0100 010 |
| 24 | 0000 0100 001 |
| 25 | 0000 0100 000 |
| 26 | 0000 0011 111 |
| 27 | 0000 0011 110 |
| 28 | 0000 0011 101 |
| 29 | 0000 0011 100 |
| 30 | 0000 0011 011 |
| 31 | 0000 0011 010 |
| 32 | 0000 0011 001 |
| 33 | 0000 0011 000 |
| Bit Stuffing | 0000 0001 110 |
| MBA Stuffing | 0000 0001 111 |
| MB Escape | 0000 0001 0000 |

Therefore, if the macroblock address is equal to one of those indicated in the MBA column as shown in the table above, then the VLC which is stored in field 801 of macroblock slice 800 is the code shown in the second column. Decoding is performed in the reverse manner. If VLC field 801 contains the code word shown in the second column, then the macroblock address which is returned is that shown in column 1.

Another field which is a VLC in MPEG is MTYPE field 802 shown in macroblock datum 800 of FIG. 8. Each frame is either an intra frame, a predicted frame, or an interpolated frame. For the macroblock type field 802 shown in FIG. 8, therefore, each of these different types of frames requires different types and therefore generate different VLC's depending on the frame type. For intra frames, the VLC's which are generated are as set forth in Table 5. Intra+Q means an intra frame+quantization. In addition, the X in the column for MQUANT which corresponds to field 703 in FIG. 7, indicates that the MQUANT field 703 is present and is set to 1.

TABLE 5

| MB Types | Intra Frames MQUANT | VLC |
|---|---|---|
| Intra | | 0 |
| Intra + Q | X | 01 |

Predicted frames are encoded as set forth in Table 6. Again, as with the intra frames, there are numerous VLC's ranging between 0 bits in length to 9. This maximum 9 bit value is shown as the last entry in Table 6.

TABLE 6

| MB Types | Predicted Frames | | | | | VLC |
|---|---|---|---|---|---|---|
| | MQUANT | MVD | CBP | TCOEFF | 8 × 8 | |
| No MC, Not Coded | | | | | | — |
| MC, Coded | | X | X | X | | 1 |
| No MC, Coded | | | X | X | | 01 |
| MC, Not Coded | | X | | | | 001 |
| 8-ESC | | | | | X | 0001 |
| Intra | | | | X | | 0000 1 |
| MC, Coded, +Q | X | X | X | X | | 0000 011 |
| No MC, coded, +Q | X | | X | X | | 0000 010 |
| Intra, +Q | X | | | X | | 0000 0011 |
| MC Coded, 2 Vect | | 2 | X | X | | 0000 0010 |
| MC Not Coded, 2 Vect | | 2 | X | X | | ` 0000 0001 |
| MC Coded, 2 Vect, +Q | X | 2 | X | X | | 0000 0000 1 |

Each column indicates by an "X" the presence of flags in the corresponding fields in macroblock 800 shown in FIG. 8. Only the "8-ESC" entry will use the actual 8×8 block encoding data as shown in FIG. 3c. The remainder of the entry shown in Table 6 generates an MTYPE field 802 containing the VLC shown in that column.

Interpolated frames will have macroblocks 800 with their MTYPE field 802 containing the values shown in table 7 below.

TABLE 7

| MB Types | Interpolated Frames | | | | | VLC |
|---|---|---|---|---|---|---|
| | MV1 | MV2 | CBP | TCOEFF | 8 × 8 | |
| Diff, MV = 0, Same Type As Previous, Not Coded | | | | | | — |
| Interpolate, Not Coded | X | X | | | | 10 |
| Interpolate, Coded | X | X | X | X | | 11 |
| Backwards, Not Coded | | X | | | | 010 |
| Backwards, Coded | | X | X | X | | 011 |
| Forwards, Not Coded | X | | | | | 0010 |
| Forwards, Coded | X | | X | X | | 0011 |
| 8-ESC | | | | | X | 0001 |
| Intra | | | | X | | 0000 1 |

As shown, only the 8-ESC mode uses the full 8×8 block data from the macroblock as discussed above. The placement of the 8×8 macroblock data is discussed below. As with the predicted frame data shown in Table 6, each of the corresponding fields in the macroblock and block data fields 800 and 900 are set forth as indicated in the table. The macroblock type field 802 in macroblock 800 is set forth as the VLC shown in the last column.

In the case of predicted frames and interpolated frames having an MBTYPE of "8-ESC". This follows the CBP field 806 of macroblock 800 shown in FIG. 8. Therefore, instead of a block layer datum 900 being present at block data field 807, the 8×8 block data from FIG. 3c is preset in field 807. CBP field 806 contains the number of each block that is present. For instance, if only the first luminance block is present, then CBP field 806 contains 32 (32*P$_1$). The BTYPE code word 901 in datum 900 indicates that the word is encoded according to the MTYPE 802 field in datum 800. BQUANT 902 is present if the block type 801 indicates that a quantizer should be updated. Motion vector data is encoded differentially in the same way the macroblock motion vector data is encoded. There are, however, some differences in the interpretation and the predictors for the differential coding. There is no difference in the encoding in the block data.

Motion vector data which is contained in fields 804 and 805 of macroblock 800 for predicted and interpolated frames are coded differentially within a macroblock slice. These vectors obey the following rules:

1) Every forward or backward motion vector is coded relative to the last vector of the same type, except for 8×8 mode;
2) the prediction motion vector is set to 0 in the macroblocks at the start of a macroblock slice, or if the last macroblock is coded in the intra mode;
3) for interpolative frames, only vectors that are used for the selective prediction mode (as contained in the macroblock type field 802) are coded. Only coded vectors can be used as prediction motion vectors and stored in fields MVD1 and MVD2 804 and 805 shown in FIG. 8.

Motion vectors MVD1 and MVD2 contained in field 804 and 805 are coded using a VLC table which will be set forth in tables 8 and 9 below. These values depend upon a vector range selection parameter "f". Integer pel tables have been extended with a modulo code and are set forth in table 8. In tables 8 and 9, the selection parameter "f" and the selection parameter "r" is a residual defined by $$r = mod(|2m| - 1, f) for - 16f < = 2m < = 15f$$

where "f" is equal to the frame distance and "m" is the fractional differential motion vector with a half pel accuracy. For "m" not equal to 0:

$$CODE(MPEG) = CODE(H.261)(v) + CODE(\text{modulo})(f, r)$$

for "m" equals 0, the MPEG code is determined as follows:

$$CODE(MPEG) = CODE(H.261)(0)$$

where:

$v = |2m| * sign(m)$    for $-16f < = 2m < = 15f, f = = 1$ $v = ((|2m| - r)/f + 1) * sign(m)$    for $-16f < = 2m < = 15f, f != 1$ and CODE(H.261)(v) is as shown in tables 8 and 9. Tables 8 and 9 also define the value of "r" for values of "m" outside the range of the formula above. Note that in this particular case, only the tables for f=1, 2, and 3 are required. If 2m exceeds the range (−16 to 15, −32 to 30, −48 to 45, −64 to 60, −80 to 75) for f=(1, 2, 3, 4, and 5) the numbers (32, 63, 94, 125, and 156) must be added or subtracted for 2m. This modified value 2m is inputted to the formulae for r and v.

The VLC's for various values of r, v, and f are shown in tables 8 and 9. In this case, f equals the frame distance.

TABLE 8

**Code for 2*MVD Using H.261 at Frame Distance 1, 2, 3**

| | f=1 | f=2 | | | | f=3 | | | | | |
|---|---|---|---|---|---|---|---|---|---|---|---|
| v(wm) | CODE(H.261) | r=0 | r=1 | r=1 | r=0 | r=0 | r=1 | r=2 | r=2 | r=1 | r=0 | CODE(H.261)(v) |
| −16 | 16 0000 0011 001 | −31 | −32 | 31 | 32 | −46 | −47 | −48 | 46 | 47 | 48 | CODE(H.261)(−16) |
| −15 | 17 0000 0011 011 | −29 | −30 | 33 | 34 | −43 | −44 | −45 | 49 | 50 | 51 | CODE(H.261)(−15) |
| −14 | 18 0000 0011 101 | −27 | −28 | 35 | 36 | −40 | −41 | −42 | 52 | 53 | 54 | CODE(H.261)(−14) |
| −13 | 19 0000 0011 111 | −25 | −26 | 37 | 38 | −37 | −38 | −39 | 55 | 56 | 57 | CODE(H.261)(−13) |
| −12 | 20 0000 0100 001 | −23 | −24 | 39 | 40 | −34 | −35 | −36 | 58 | 59 | 60 | CODE(H.261)(−12) |
| −11 | 21 0000 0100 011 | −21 | −22 | 41 | 42 | −31 | −32 | −33 | 61 | 62 | 63 | CODE(H.261)(−11) |
| −10 | 22 0000 0100 11 | −19 | −20 | 43 | 44 | −28 | −29 | −30 | 64 | 65 | 66 | CODE(H.261)(−10) |
| −9 | 23 0000 0101 01 | −17 | −18 | 45 | 46 | −25 | −26 | −27 | 67 | 68 | 69 | CODE(H.261)(−9) |
| −8 | 24 0000 0101 11 | −15 | −16 | 47 | 48 | −22 | −23 | −24 | 70 | 71 | 72 | CODE(H.261)(−8) |
| −7 | 25 0000 0111 | −13 | −14 | 49 | 50 | −19 | −20 | −21 | 73 | 74 | 75 | CODE(H.261)(−7) |
| −6 | 26 0000 1001 | −11 | −12 | 51 | 52 | −16 | −17 | −18 | 76 | 77 | 78 | CODE(H.261)(−6) |
| −5 | 27 0000 1011 | −9 | −10 | 53 | 54 | −13 | −14 | −16 | 79 | 80 | 81 | CODE(H.261)(−5) |
| −4 | 28 0000 111 | −7 | −8 | 55 | 56 | −10 | −11 | −12 | 82 | 83 | 84 | CODE(H.261)(−4) |
| −3 | 29 0001 1 | −5 | −6 | 57 | 58 | −7 | −8 | −9 | 85 | 86 | | CODE(H.261)(−3) |
| −2 | 0011 | −3 | −4 | | | −4 | −5 | −6 | | | | CODE(H.261)(−2) |
| −1 | 011 | −1 | −2 | | | −1 | −2 | −3 | | | | CODE(H.261)(−1) |
| 0 | 1 | | 0 | | | | 0 | | | | | CODE(H.261)(0) |
| 1 | 010 | 1 | 2 | | | 1 | 2 | 3 | | | | CODE(H.261)(1) |
| 2 | 0010 | 3 | 4 | | | 4 | 5 | 6 | | | | CODE(H.261)(2) |
| 3 | −29 0001 0 | 5 | 6 | −57 | −58 | 7 | 8 | 9 | −85 | −86 | | CODE(H.261)(3) |
| 4 | −28 0000 110 | 7 | 8 | −55 | −56 | 10 | 11 | 12 | −82 | −83 | −84 | CODE(H.261)(4) |
| 5 | −27 0000 1010 | 9 | 10 | −53 | −54 | 13 | 14 | 15 | −79 | −80 | −81 | CODE(H.261)(5) |
| 6 | −26 0000 1000 | 11 | 12 | −51 | −52 | 16 | 17 | 18 | −76 | −77 | −78 | CODE(H.261)(6) |
| 7 | −25 0000 0110 | 13 | 14 | −49 | −50 | 19 | 20 | 21 | −73 | −74 | −75 | CODE(H.261)(7) |
| 8 | −24 0000 0101 10 | 15 | 16 | −47 | −48 | 22 | 23 | 24 | −70 | −71 | −72 | CODE(H.261)(8) |
| 9 | −23 0000 0101 00 | 17 | 18 | −45 | −46 | 25 | 26 | 27 | −67 | −68 | −69 | CODE(H.261)(9) |
| 10 | −22 0000 0100 10 | 19 | 20 | −43 | −44 | 28 | 29 | 30 | −64 | −65 | −66 | CODE(H.261)(10) |
| 11 | −21 0000 0100 010 | 21 | 22 | −41 | −42 | 31 | 32 | 33 | −61 | −62 | −63 | CODE(H.261)(11) |
| 12 | −20 0000 0100 000 | 23 | 24 | −39 | −40 | 34 | 35 | 36 | −58 | −59 | −60 | CODE(H.261)(12) |
| 13 | −19 0000 0011 110 | 25 | 26 | −37 | −38 | 37 | 38 | 39 | −55 | −56 | −57 | CODE(H.261)(13) |
| 14 | −18 0000 0011 100 | 27 | 28 | −35 | −36 | 40 | 41 | 42 | −52 | −53 | −64 | CODE(H.261)(14) |
| 15 | −17 0000 0011 010 | 29 | 30 | −33 | −34 | 43 | 44 | 45 | −49 | −50 | −51 | CODE(H.261)(15) |

TABLE 9

**Code for 2*MVD Using H.261 at Frame Distance 1, 2, 3**

| f=4 | | | | | | | | |
|---|---|---|---|---|---|---|---|---|
| r=0 | r=1 | r=2 | r=3 | r=3 | r=2 | r=1 | r=0 | CODE(H.261)(v) |
| −61 | −62 | −63 | −64 | 61 | 62 | 63 | 64 | CODE(H.261)(−16) |
| −57 | −58 | −59 | −60 | 65 | 66 | 67 | 68 | CODE(H.261)(−15) |
| −53 | −54 | −55 | −56 | 69 | 70 | 71 | 72 | CODE(H.261)(−14) |
| −49 | −50 | −51 | −52 | 73 | 74 | 75 | 76 | CODE(H.261)(−13) |
| −45 | −46 | −47 | −48 | 77 | 78 | 79 | 80 | CODE(H.261)(−12) |
| −41 | −42 | −43 | −44 | 81 | 82 | 83 | 84 | CODE(H.261)(−11) |
| −37 | −38 | −39 | −40 | 85 | 86 | 87 | 88 | CODE(H.261)(−10) |
| −33 | −34 | −35 | −36 | 89 | 90 | 91 | 92 | CODE(H.261)(−9) |
| −29 | −30 | −31 | −32 | 93 | 94 | 95 | 96 | CODE(H.261)(−8) |
| −25 | −26 | −27 | −28 | 97 | 98 | 99 | 100 | CODE(H.261)(−7) |
| −21 | −22 | −23 | −24 | 101 | 102 | 103 | 104 | CODE(H.261)(−6) |
| −17 | −18 | −19 | −20 | 105 | 106 | 107 | 108 | CODE(H.261)(−5) |
| −13 | −14 | −15 | −16 | 109 | 110 | 111 | 112 | CODE(H.261)(−4) |
| −9 | −10 | −11 | −12 | 113 | 114 | | | CODE(H.261)(−3) |
| −5 | −6 | −7 | −8 | | | | | CODE(H.261)(−2) |
| −1 | −2 | −3 | −4 | | | | | CODE(H.261)(−1) |
| | 0 | | | | 0 | | | CODE(H.261)(0) |
| 1 | 2 | 3 | 4 | | | | | CODE(H.261)(1) |
| 5 | 6 | 7 | 8 | | | | | CODE(H.261)(2) |
| 9 | 10 | 11 | 12 | −113 | −114 | | | CODE(H.261)(3) |
| 13 | 14 | 15 | 16 | −109 | −110 | −111 | −112 | CODE(H.261)(4) |
| 17 | 18 | 19 | 20 | −105 | −106 | −107 | −108 | CODE(H.261)(5) |
| 21 | 22 | 23 | 24 | −101 | −102 | −103 | −104 | CODE(H.261)(6) |
| 25 | 26 | 27 | 28 | −97 | −98 | −99 | −90 | CODE(H.261)(7) |
| 29 | 30 | 31 | 32 | −93 | −94 | −95 | −96 | CODE(H.261)(8) |
| 33 | 34 | 35 | 36 | −89 | −90 | −91 | −92 | CODE(H.261)(9) |
| 37 | 38 | 39 | 40 | −85 | −86 | −87 | −88 | CODE(H.261)(10) |
| 41 | 42 | 43 | 44 | −81 | −82 | −83 | −84 | CODE(H.261)(11) |
| 45 | 46 | 47 | 48 | −77 | −78 | −79 | −80 | CODE(H.261)(12) |
| 49 | 50 | 51 | 52 | −73 | −74 | −75 | −76 | CODE(H.261)(13) |
| 53 | 54 | 55 | 56 | −69 | −70 | −71 | −72 | CODE(H.261)(14) |

TABLE 9-continued

Code for 2*MVD Using H.261 at Frame Distance 1, 2, 3

| 57 | 58 | 59 | 60 | −65 | −66 | −67 | −68 | CODE(H.261)(15) |
|---|---|---|---|---|---|---|---|---|
| f=5 | | | | | | | | |
| r=0 | r=1 | r=2 | r=3 | r=4 | r=4 | r=3 | r=2 | r=1 | r=9 | CODE(H.261)(v) |

| r=0 | r=1 | r=2 | r=3 | r=4 | r=4 | r=3 | r=2 | r=1 | r=9 | CODE(H.261)(v) |
|---|---|---|---|---|---|---|---|---|---|---|
| −76 | −77 | −78 | −79 | −80 | 76 | 77 | 78 | 79 | 80 | CODE(H.261)(−16) |
| −71 | −72 | −73 | −74 | −75 | 81 | 82 | 83 | 84 | 85 | CODE(H.261)(−15) |
| −66 | −67 | −68 | −69 | −70 | 86 | 87 | 88 | 89 | 90 | CODE(H.261)(−14) |
| −61 | −62 | −63 | −64 | −65 | 91 | 92 | 92 | 94 | 95 | CODE(H.261)(−13) |
| −56 | −57 | −58 | −59 | −60 | 96 | 97 | 98 | 99 | 100 | CODE(H.261)(−12) |
| −51 | −52 | −53 | −54 | −55 | 101 | 102 | 103 | 104 | 105 | CODE(H.261)(−11) |
| −46 | −47 | −48 | −49 | −50 | 106 | 107 | 108 | 109 | 110 | CODE(H.261)(−10) |
| −41 | −42 | −43 | −44 | −45 | 111 | 112 | 113 | 114 | 115 | CODE(H.261)(−9) |
| −36 | −37 | −38 | −39 | −40 | 116 | 117 | 118 | 119 | 120 | CODE(H.261)(−8) |
| −31 | −32 | −33 | −34 | −35 | 121 | 122 | 123 | 124 | 125 | CODE(H.261)(−7) |
| −26 | −27 | −28 | −29 | −30 | 126 | 127 | 128 | 129 | 130 | CODE(H.261)(−6) |
| −21 | −22 | −23 | −24 | −25 | 131 | 132 | 133 | 134 | 135 | CODE(H.261)(−5) |
| −16 | −17 | −18 | −19 | −20 | 136 | 137 | 138 | 139 | 140 | CODE(H.261)(−4) |
| −11 | −12 | −13 | −14 | −15 | 141 | 142 | | | | CODE(H.261)(−3) |
| −6 | −7 | −8 | −9 | −10 | | | | | | CODE(H.261)(−2) |
| −1 | −2 | −3 | −4 | −5 | | | | | | CODE(H.261)(−1) |
| | | | | | 0 | | | | | CODE(H.261)(0) |
| 1 | 2 | 3 | 4 | 5 | | | | | | CODE(H.261)(1) |
| 6 | 7 | 8 | 9 | 10 | | | | | | CODE(H.261)(2) |
| 11 | 12 | 13 | 14 | 15 | −141 | −142 | | | | CODE(H.261)(3) |
| 16 | 17 | 18 | 19 | 20 | −136 | −137 | −138 | −139 | −140 | CODE(H.261)(4) |
| 21 | 22 | 23 | 24 | 25 | −131 | −132 | −133 | −134 | −135 | CODE(H.261)(5) |
| 26 | 27 | 28 | 29 | 30 | −126 | −127 | −128 | −129 | −130 | CODE(H.261)(6) |
| 31 | 32 | 33 | 34 | 35 | −121 | −122 | −123 | −124 | −125 | CODE(H.261)(7) |
| 36 | 37 | 38 | 39 | 40 | −116 | −117 | −118 | −119 | −120 | CODE(H.261)(8) |
| 41 | 42 | 43 | 44 | 45 | −111 | −112 | −113 | −114 | −115 | CODE(H.261)(9) |
| 46 | 47 | 48 | 49 | 50 | −106 | −107 | −108 | −109 | −110 | CODE(H.261)(10) |
| 51 | 52 | 53 | 54 | 55 | −101 | −102 | −103 | −104 | −105 | CODE(H.261)(11) |
| 56 | 57 | 58 | 59 | 60 | −96 | −97 | −98 | −99 | −100 | CODE(H.261)(12) |
| 61 | 62 | 63 | 64 | 65 | −91 | −92 | −93 | −94 | −95 | CODE(H.261)(13) |
| 66 | 67 | 58 | 69 | 70 | −86 | −87 | −88 | −89 | −90 | CODE(H.261)(14) |
| 71 | 72 | 73 | 74 | 75 | −81 | −82 | −83 | −84 | −85 | CODE(H.261)(15) |

In addition to the MVD1 and MVD2 fields 804 and 805 in macroblock 800 being encoded, the CBP field 806 in 800 is also generated using a VLC. The number stored in CBP field 806 indicates which of the macroblocks are encoded according to the scheme set forth in FIG. 3d. The number stored in CBP field 806 is known as the pattern number and is determined as follows:

Pattern
number $= 32*P_1 + 16*P_2 + 8*P_3 + 4*P_4 + 2*P_5 + P_6$ where $P_N$ is 1 if any coefficient is present for block N. The pattern number that is stored in CBP field 806 of macroblock 800 thus set forth according to table 10.

TABLE 10

| VLC Table for CBP | |
|---|---|
| CBP | Code |
| 60 | 111 |
| 4 | 1101 |
| 8 | 1100 |
| 16 | 1011 |
| 32 | 1010 |
| 12 | 1001 1 |
| 48 | 1001 0 |
| 20 | 1000 1 |
| 40 | 1000 0 |
| 28 | 0111 1 |
| 44 | 0111 0 |
| 52 | 0110 1 |
| 56 | 0110 0 |
| 1 | 0101 1 |
| 61 | 0101 0 |
| 2 | 0100 1 |
| 62 | 0100 0 |
| 24 | 0011 11 |
| 36 | 0011 10 |
| 3 | 0011 01 |
| 63 | 0011 00 |

TABLE 10-continued

| VLC Table for CBP | |
|---|---|
| CBP | Code |
| 5 | 0010 111 |
| 9 | 0010 110 |
| 17 | 0010 101 |
| 33 | 0010 100 |
| 6 | 0010 011 |
| 10 | 0010 010 |
| 18 | 0010 001 |
| 34 | 0010 000 |
| 7 | 0001 1111 |
| 11 | 0001 1110 |
| 19 | 0001 1101 |
| 35 | 0001 1100 |
| 13 | 0001 1011 |
| 49 | 0001 1010 |
| 21 | 0001 1001 |
| 41 | 0001 1000 |
| 14 | 0001 0111 |
| 50 | 0001 0110 |
| 22 | 0001 0101 |
| 42 | 0001 0100 |
| 15 | 0001 0011 |
| 51 | 0001 0010 |
| 23 | 0001 0001 |
| 43 | 0001 0000 |
| 25 | 0000 1111 |
| 37 | 0000 1110 |
| 26 | 0000 1101 |
| 38 | 0000 1100 |
| 29 | 0000 1011 |
| 45 | 0000 1010 |
| 53 | 0000 1001 |
| 57 | 0000 1000 |
| 30 | 0000 0111 |
| 46 | 0000 0110 |
| 54 | 0000 0101 |
| 58 | 0000 0100 |
| 31 | 0000 0011 1 |
| 47 | 0000 0011 0 |

TABLE 10-continued

| VLC Table for CBP | |
|---|---|
| CBP | Code |
| 55 | 0000 0010 1 |
| 59 | 0000 0010 0 |
| 27 | 0000 0001 1 |
| 39 | 0000 0001 0 |

In addition, TCOEFF field 904 of each block 900 are also encoded using a VLC. Note that in the table the end of block (EOB) value is shown because the CBP may indicate those blocks that have no coefficient data, and an EOB cannot occur as a first coefficient. This value will be contained in a field 805, however, if there are no transform coefficients, EOB 805 will occur immediately after the MVD1 field 803 in block datum 800. Therefore, end of block may be removed from the VLC table when it is the first coefficient. The last bit "s" indicates the sign of the level for the transform coefficient in table 11. 0 indicates a positive value and 1 indicates a negative value. Transform coefficients are coded as set forth in table 11.

TABLE 11

| VLC Table for TCOEFF | | | | | |
|---|---|---|---|---|---|
| Rub | Level | Code | Run | Level | Code |
| | EOB | 10 | | | |
| 0 | 1 | 1s IF FIRST COEFFICIENT | 5 | 1 | 0001 11S |
| 0 | 1 | 11s NOT FIRST COEFFICIENT | 5 | 2 | 0000 0010 01S |
| 0 | 2 | 0100s | 5 | 3 | 0000 0000 1001 0S |
| 0 | 3 | 0010 1s | 6 | 1 | 0001 01S |
| 0 | 4 | 0000 110s | 6 | 2 | 0000 0001 1110S |
| 0 | 5 | 0010 0110s | 7 | 1 | 0001 00S |
| 0 | 6 | 0010 0001s | 7 | 2 | 0000 0001 0101S |
| 0 | 7 | 0000 0010 10s | 8 | 1 | 0000 111S |
| 0 | 8 | 0000 0001 1101s | 8 | 2 | 0000 0001 0001S |
| 0 | 9 | 0000 0001 1000s | 9 | 1 | 0000 101S |
| 0 | 10 | 0000 0001 0011s | 9 | 2 | 0000 0000 1000 1S |
| 0 | 11 | 0000 0001 0000s | 10 | 1 | 0010 0111S |
| 0 | 12 | 0000 0000 1101 0s | 10 | 2 | 0000 0000 1000 0S |
| 0 | 13 | 0000 0000 1101 1s | 11 | 1 | 0010 0011S |
| 0 | 14 | 0000 0000 1100 0s | 12 | 1 | 0010 0010S |
| 0 | 15 | 0000 0000 1011 1s | 13 | 1 | 0010 0000S |
| 1 | 1 | 011s | 14 | 1 | 0000 0011 10S |
| 1 | 2 | 0001 10s | 15 | 1 | 0000 0011 01S |
| 1 | 3 | 0010 0101s | 16 | 1 | 0000 0010 00S |
| 1 | 4 | 0000 0011 00s | 17 | 1 | 0000 0001 1111S |
| 1 | 5 | 0000 0001 1011s | 18 | 1 | 0000 0001 1010S |
| 1 | 6 | 0000 0000 1011 0s | 19 | 1 | 0000 0001 1001S |
| 1 | 7 | 0000 0000 1010 1s | 20 | 1 | 0000 0001 0111S |
| 2 | 1 | 0101s | 21 | 1 | 0000 0001 0110S |
| 2 | 2 | 0000 100s | 22 | 1 | 0000 0000 1111 1S |
| 2 | 3 | 0000 0010 11s | 23 | 1 | 0000 0000 1111 0S |
| 2 | 4 | 0000 0001 0100 | 24 | 1 | 0000 0000 1110 1S |
| 2 | 5 | 0000 0000 1010 0s | 25 | 1 | 0000 0000 1110 0S |
| 3 | 1 | 0011 1s | 27 | 1 | 0000 0000 1101 1S |
| 3 | 2 | 0010 0100s | | ESCAPE | 0000 01 |
| 3 | 3 | 0000 0001 1100s | | | |
| 3 | 4 | 0000 0000 1001 1s | | | |
| 4 | 1 | 0011 0s | | | |
| 4 | 2 | 0000 0011 11s | | | |
| 4 | 3 | 0000 0001 0010s | | | |

Figure 10:
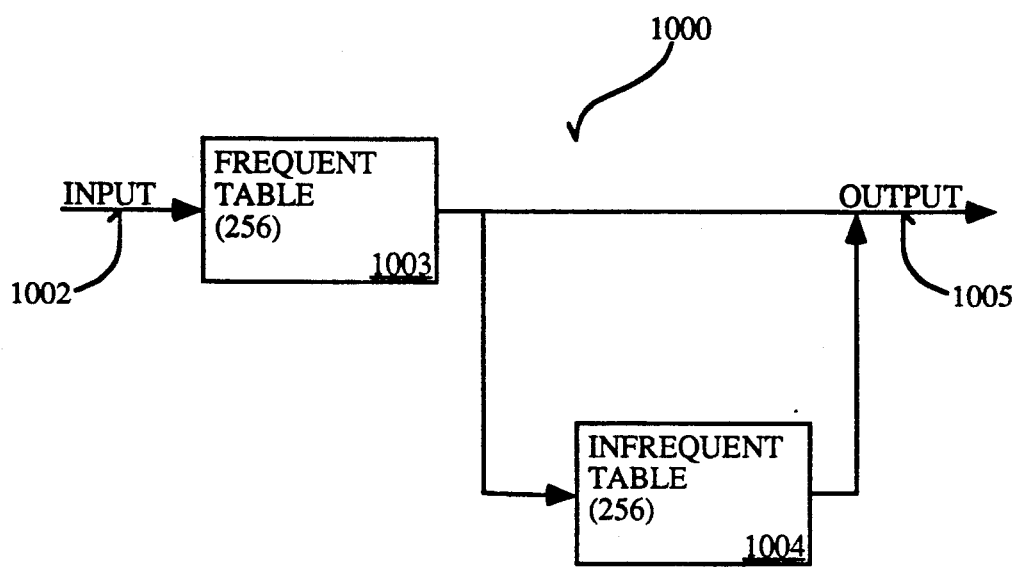
FIG. 10 shows a basic two-stage lookup table approach of the preferred embodiment.

The preferred embodiment implements a multiple tiered lookup table approach in order to accomplish the decoding performed by the video multiplexing decoder 152 as shown in FIG. 1. This scheme divides the very large lookup tables required by the multiplex decoder into several smaller tables. This basic idea is represented with reference to FIG. 10. As shown in FIG...10, a two-stage decoding example is shown. Incoming encoded data is input as a bit stream 1002 shown in FIG. 10. This data is a VLC code word such as contained in a macroblock 800 as shown in FIG. 8, and may contain VLC's which may be as long as 14 bits in length. For a VLC which has a maximum length of 14 bits, a single lookup table containing $2^{14}$ entries (16,284) is required in the prior art method in order to provide decoding for all of the possible VLC's. However, in the preferred embodiment, the bit stream is broken into two distinct portions, to address two smaller lookup tables. For instance, as shown in FIG. 10, 1000 may contain two lookup tables 1003 known as the "frequent" lookup table, and 1004 which is known as the "infrequent" lookup table. Each of these tables contain $2^8$ entries (256) to allow full decoding of the incoming bit stream. Frequent table 1003, is used for the most frequent occurrences of the first 8 bits in the incoming bit stream 1002. Because a great majority of the VLC's will be 8 bits in length or less, the decoded values may be obtained by a quick lookup into frequent table 1003. The decoding that cannot be performed by the first table will lead to indirection into the "infrequent" table 1004. Therefore, if the first eight bits are a predetermined value, for example 0000 0000 (for an infrequently occurring VLC), then the frequent table will contain a pointer to infrequent table 1004. 1004 contains entries for VLC's which may be seen decoder circuitry less frequently than those given in table 1003. For the vast majority of operations, lookups will be a single cycle operation by addressing an element in the 256 entry frequent table 1003. Tables 1003 and 1004 will return the decoded value as output stream 1005. In the preferred embodiment, the first eight bits of the VLC's in the MPEG and CCITT standards are used 80% of the time. Therefore, 80% of the time, only a single lookup into frequent table 1003 is required. The infrequent table is used for cases wherein the VLC extends beyond the first eight bits and returns values for the remaining 20% of VLC's which may be seen.

Figure 11:
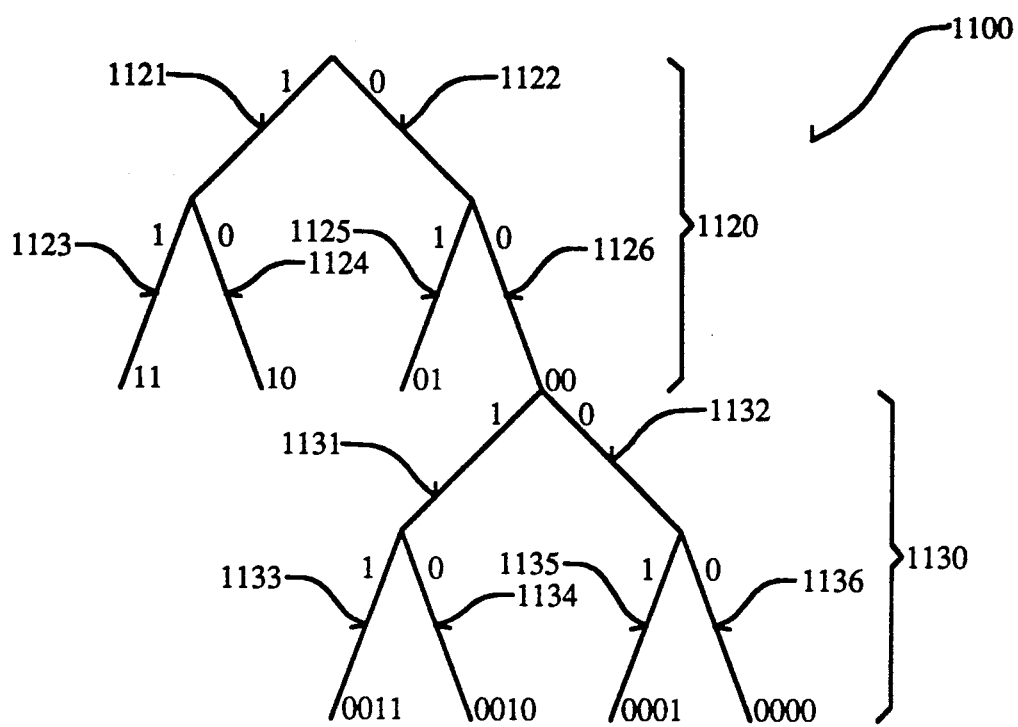
FIG. 11 shows how lookuyp table may be broken into separate stages as in the preferred embodiment.

In a very simple case, as shown in FIG. 11, a variable length code word which has seven source symbols is shown in FIG. 11. FIG. 11 shows how a variable length code word which is input may be stored in a table containing only four entries each. The preferred embodiment takes advantage of the fact that not all possible VLC's for the maximum length of the codeword are mapped. This can be appreciated by viewing the VLC's set forth in the foregoing tables. This is also graphically represented in FIGS. 11 and 12. With a traditional lookup table approach, a VLC with a maximum length of 4 bits requires a single lookup table containing 16 entries or $2^4$. Using two lookup tables, each with four entries, it is possible to reduce the amount of storage required by the lookup tables by a factor of 2. For instance, with reference to FIG. 11, a tree such as 1100 is used to represnet two separate lookup tables for an incoming encoded bit stream. The first lookup table is graphically represented using 1120 and the second lookup table is graphically represented with 1130 shown in FIG. 11. Frequent lookup table 1120 is used to represent the most frequently occurring bit patterns in an incoming VLC. For instance, an incoming bit stream which is preceded by 1 will transverse the left hand side of the tree 1121 shown graphically in FIG. 11. As shown in FIG. 11, each progressive level in the tree adds one additional bit of accuracy to the codeword. A bit stream preceded by 1 traverses the left hand side of the tree 1121 and depending on whether the following bit in that bit stream is a 1 or a 0 the left subtree 1123 or the right subtree 1124 will be traversed. If the following bit is a 1, then the left most branch of the tree is traversed 1123 for a codeword "11". If the next digit in the incoming bit stream is a 0, however, then 1124 is traversed. If, on the other hand, the first digit in the incoming bit stream was a 0, then branch 1122 is traversed. As shown in FIG. 11, and as discussed before, the next bit in the VLC bit stream will determine which branch will be taken. If the next bit is a 1, then branch 1125 is taken. On the other hand, if the next bit is a 0, then branch 1126 is taken. As discussed with reference to FIG. 10 above, 1126 is essentially a pointer or indirection to the second "infrequent" table 1130 as graphically represented in FIG. 11.

Branches 1123, 1124, and 1125 return values only from the frequent lookup table 1120 in the example shown in FIG. 11, however, 1126 yields a pointer to the second lookup table graphically represented as 1130. Again, as with the previous examples, the next bit in the incoming bit stream is determined for the beginning of second lookup table 1130. In 1130, the next bit will again be checked determining whether branches 1131 or 1132 are taken in the path to the decoded value. Again, as above, 1131 is taken if the next bit in the bit stream is a 1 and 1133 is taken if the following bit after that is also a 1. 1134 is taken if the following number is a 0. 1132 is taken if the first bit after the entry into second lookup table 1130 is a 0 and 1135 is taken if the subsequent bit is a 1. 1136 is taken if all 4 bits which are used to encode the value are 0's. As can be appreciated by viewing FIG. 11, certain patterns do not return values at all. For instance, there are no four-bit codewords that precede with 11, 10, or 01. The preferred embodiment takes advantage of this fact because in Huffman encoding used for VLC's in MPEG and CCITT, there are no VLC's that are preceded by certain values.

As can be appreciated, the incoming VLC word may vary in length from two bit to four bits as shown in FIG. 11, the eight entries which will be required to represent all of the possible values of the 4 bits in Huffman encoding is represented quite easily with two stages of decoding and four entries each for each of the stages for a total of eight entries.

Figure 12:
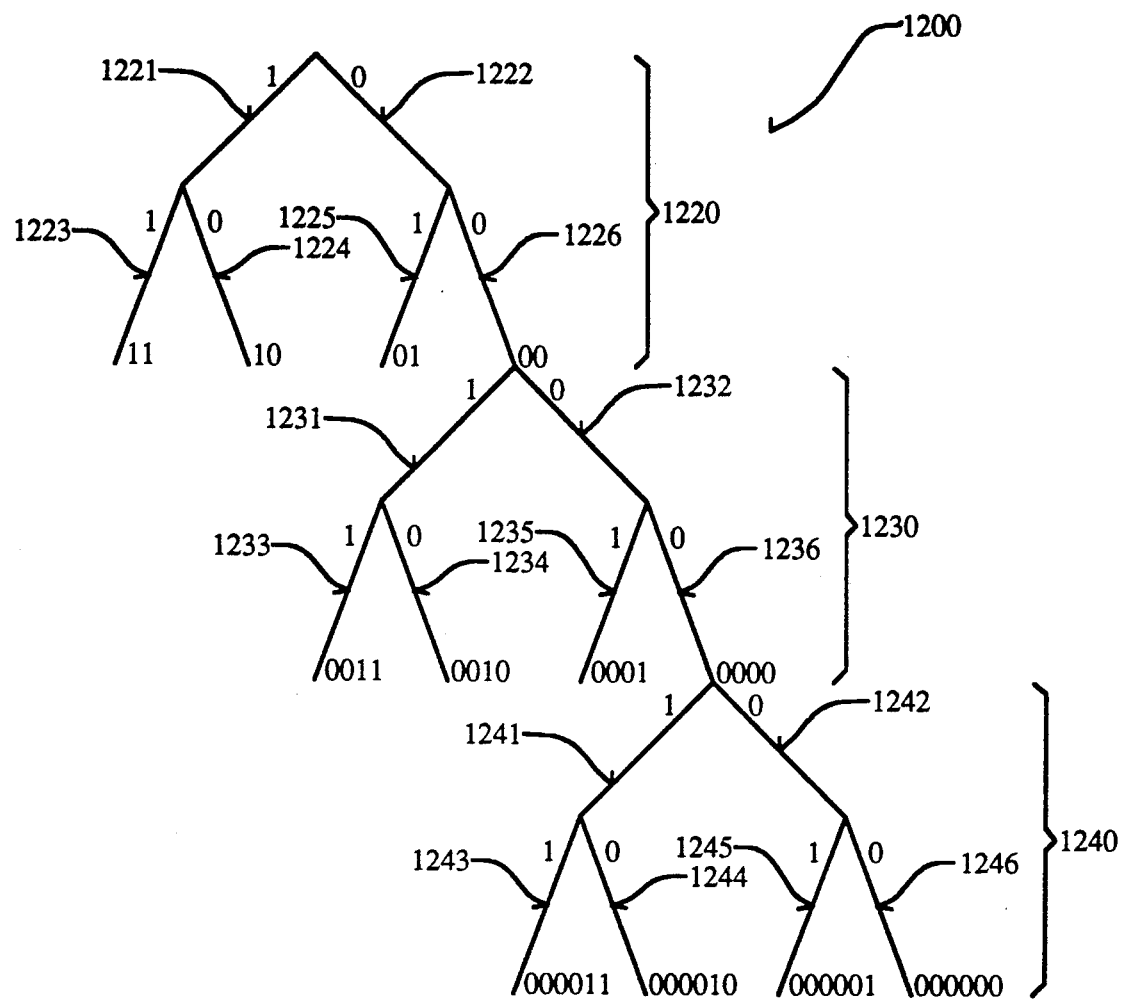
FIG. 12 shows a second example of a lookup table broken into multiple stages as used by the preferred embodiment.

An example with 10 source symbols is graphically represented in FIG. 12 as 1200 using three separate lookup tables 1220, 1230, and 1240. As shown in FIG. 12, the first lookup table 1220 will encode for the two most significant bits in the codeword into a series of paths for a left most path through routes 1221 and 1223 for a codeword "11". The right-next path 1224 will be returned for a codeword containing "10". A codeword will lead to path 1225. If the first two most significant bits of the codeword are equal to 0, then path 1226 is taken in lookup table 1220 leading to an indirection to the second lookup table 1230. Therefore, any codewords having 00 in the first two most significant bits, will lead to table 1230. 1230, as discussed above with reference to 1220, will lead to path 1231 and 1233 if the next 2 bits are 1's. If the next bit is a 1 and the following bit is a 0, then paths 1231 and 1234 are taken. If however, the next bit is a 0 in table 1230, then path 1232 is taken. If the following bit is a 1, 1235 is taken and if bit after that is also a 0, 1236 is taken again leading to another indirection into table 1240. In table 1240, left branch 1241 is taken if the next bit is a 1 and 1243 is taken if the bit after that is a 1. If, however, the fifth bit is a 1 and the sixth is a 0, path 1244 is taken. Path 1242 is taken if the fifth bit is a 0 and 1245 is taken if the sixth bit is a 1. 1246 is taken if the entire six bit codeword contains 0's. This table, then, provides the total amount of decoding required for a 6 bit VLC. In a single table, a 6 bit VLC will generate a table containing 64 entries. However, a series of tables 1200 described by tables 1220, 1230, and 1240 which employs Huffman encoding uses only four entries in each table for a total of twelve. Thus, the storage required for storing the table is reduced by a factor of 5.3. Although only a two-stage lookup table and a three-stage lookup table is described, this idea can be extended to any number of lookup tables, for as many stages of decoding that is required. Also, each stage may have more than one lookup table associated with it. For instance, in a first stage lookup table, there may be two entries containing pointers, such as for the values "00" and "01". Then, each of these entries may contain pointers to either two second-stage lookup tables or the same second-stage lookup table.

As the code tree gets more complicated, and thus the maximum length of the VLC increases, the memory savings increases drastically for Huffman encoding. For instance, with the MPEG VLC which comprises a maximum bit count of 14, a single lookup table approach will require 16,000 entries. With a two stage lookup table, as discussed with reference to FIG. 10, it takes only 512 entries each table having only 256 entries each. Thus, memory savings has been reduced by a factor of 32.

As an example for MPEG VLC decoding, a bit stream of "0110 0101 . . . " is received. The decoder looks at the first 8 bits by first table, which decodes the stream into (0, 2) with length of 5 instantly. As another example, if the bit stream received is "0000 0000 110 10 . . . ". With a two-stage decoding technique as described, the decoder will again look at the first 8 bits "0000 0000". The frequent table (the first one) will indicate this bit stream belongs to infrequent category, therefore it requires a second table lookup. The second table decodes the next six bits and outputs the result as (24, 1) with length of 13.

Figure 13:
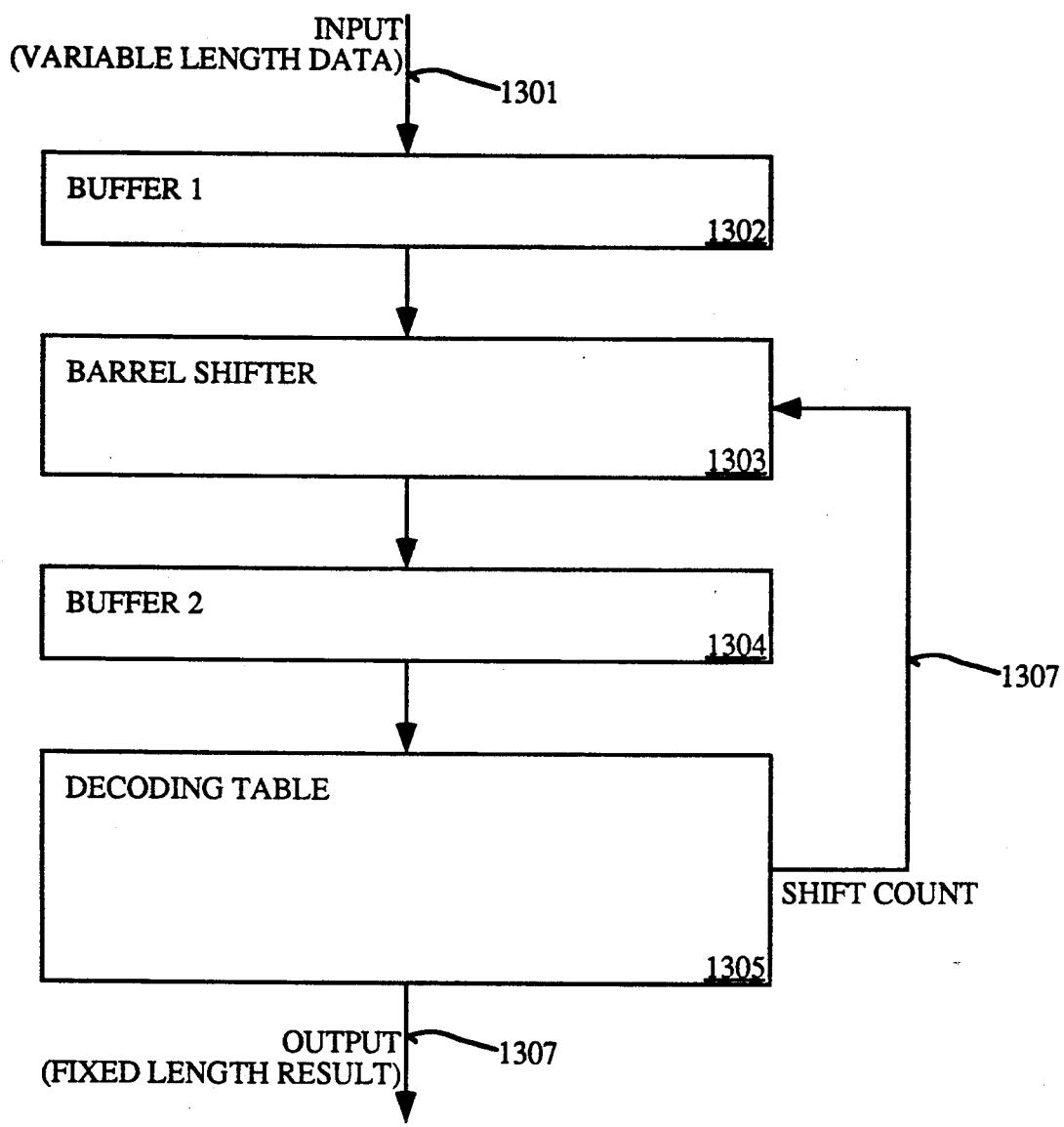
FIG. 13 shows an alternative embodiment which utilizes a double buffering scheme.

In an alternative embodiment, a double buffering variable length coding scheme may be used wherein data is available at all times and encoding and decoding can be done for variable to fixed code words, fixed to variable words, and variable to variable code words. As shown in FIG. 13, the scheme will utilize a first buffer 1302 which receives VLC input data stream 1301. The first buffer 1302 will feed into barrel shifter 1303, which will then feed into the second buffer 1304. The second buffer will hold data until such time as the decoding table 1305 requires it, thus generating a fixed length result over 1306. If, however, the decoding table cannot map a value to the input word received from second buffer 1304, then a shift count is incremented over line 1307 for barrel shifter 1303 thus feeding data back through the loop to determine a proper value for the decoded VLC.

Thus, an invention for decoding variable length code words using lookup tables in video applications has been described. Although the present invention has been described particularly with reference to FIGS. 1 through 13 and MPEG video coding standard, it will be apparent to one skilled in the art that the present invention has utility far exceeding that disclosed in the figures such as use in CCITT and JPEG video standards, or any coding scheme which uses variable-length encoding, such as sound or data compression. It is contemplated that many changes and modifications may be made, by one of ordinary skill in the art, without departing from the spirit and scope of the invention as disclosed above.

What is claimed is:

1. In a data processing apparatus, a method for decoding a variable length codeword (VLC), said VLC being a portion of an encoded bitstream in said data processing apparatus comprising the following steps:
 a. reading a VLC from said encoded bitstream, the VLC having a maximum length of X bits;
 b. using the VLC as an index into a first table, the first table containing decoded values for all possible VLC's with first Y bits not equal to any value in a first set of values, wherein Y is less than X, and if the first Y bits of the VLC are not equal to any value in the first set of values then returning a second decoded value from the first table; and
 c. if the first Y bits of the VLC are equal to any value in the first set of values, then returning a pointer to a second table from the first table, using the VLC as an index into the second table, and returning a third decoded value from the second table.

2. The method of claim 1 wherein the VLC contains video information.

3. The method of claim 2 wherein the VLC is encoded according to the Motion Picture Experts Group (MPEG) standard.

4. The method of claim 2 wherein the VLC is encoded according to the Joint Photographer Experts Group (JPEG) standard.

5. The method of claim 2 wherein the VLC is encoded according to the CCITT standard.

6. In a data processing apparatus, a method for decoding a variable length codeword (VLC), said VLC being a portion of an encoded bitstream in said data processing apparatus comprising the following steps:
 a. reading a VLC from said encoded bitstream, the VLC having a maximum length of X bits;
 b. using the VLC as an index into a first table, the first table containing decoded values for all possible VLC's having first Y bits not equal to any value in a first set of values, wherein Y is less than X, and if the first Y bits of the VLC are not equal to any value in a first set of values then returning a second decoded value from the first table;
 c. if the first Y bits of the VLC are equal to any value in the first set of values, then returning a pointer to a second table from the first table, using the VLC as an index into the second table, and if first Z bits of the VLC are not equal to any value in a third set of values, wherein Z is less than X, then returning a fourth decoded value from the second table; and
 d. if first Z bits of the VLC are equal to any value in the third set of values, then returning a pointer to a third table from the second table, using the VLC as an index into the third table, and returning a fifth decoded value from the third table.

7. The method of claim 6 wherein the VLC contains video information.

8. The method of claim 7 wherein the VLC is encoded according to the Motion Picture Experts Group (MPEG) standard.

9. The method of claim 7 wherein the VLC is encoded according to the Joint Photographer Experts Group (JPEG) standard.

10. The method of claim 7 wherein the VLC is encoded according to the CCITT standard.

11. A data processing apparatus for decoding a variable length codeword (VLC), said VLC being a portion of an encoded bitstream in said data processing apparatus comprising:
 a. a means for reading a VLC from said encoded bitstream, the VLC having a maximum length of X bits;
 b. a first table containing decoded values for all possible VLC's with first Y bits not equal to any value in a first set of values, wherein Y is less than X, the first table providing a second decoded value responsive to receiving the VLC if the first Y bits of the VLC are not equal to any value in the first set of values; and
 c. means for returning a pointer to a second table from the first table if the first Y bits of the VLC are equal to any value in the first set of values, means for using the VLC as an index into the second table, and the second table providing a third decoded value responsive to receiving the VLC.

12. A data processing apparatus for decoding a variable length codeword (VLC) X bits in length, comprising a plurality of lookup tables, each lookup table having:
 a) entries containing decoded values for Y bits in the VLC, wherein Y is less than X; and
 b) at least one of the entries in one lookup table containing a pointer to a subsequent lookup table for the Y bits in the VLC.

13. The apparatus of claim 12 wherein the Y bits comprise Y least significant bits in the VLC.

14. In a data processing system, a method of decoding a variable length codeword (VLC), said VLC being a portion of an encoded bitstream in said data processing apparatus comprising the following steps:

a. retrieving a VLC from said encoded bitstream, said VLC having a first length;

b. applying the VLC to a first lookup table, the first lookup table containing entries associating first combinations of X bits of said VLC with a first set of decoded values, a first entry for a first value of said X bits of said VLC containing a reference to a second lookup table, said second lookup table containing entries associating combinations of Y bits of said VLC with a second set of decoded values, said X and Y bits comprising different portions of said VLC, and X and Y being less than said first length and representing different portions of said VLC; and c. if said X bits of said VLC are equal to said first value then retrieving said first entry, applying said Y bits of said VLC to said second lookup table, and retrieving a second decoded value from said second lookup table, otherwise retrieving a first decoded value from said first lookup table.

15. The method of claim 14 wherein said second lookup table further comprises a second entry for a second value of said Y bits of said VLC containing a reference to a third lookup table, said third lookup table containing entries associating combinations of Z bits of said VLC with a third set of decoded values, said Z bits comprising different portions of said VLC than said X and Y bits, Z being less than said first length, said method further comprising the additional step of determining if said Y bits of said VLC are equal to said second value then retrieving said second entry, applying said Z bits of said VLC to said third lookup table, and retrieving a third decoded value from said third lookup table.

16. The method of claim 14 wherein the first and second lookup tables reside in a non-volatile memory.

17. The method of claim 15 wherein the first, second, and third lookup table reside in a non-volatile memory.

18. The method of claim 14 wherein the VLC is encoded in Huffman type encoding.

19. The method of claim 14 wherein the VLC is encoded according to Motion Picture Experts Group (MPEG) specifications.

20. The method of claim 14 wherein the VLC is encoded according to International Consultative Committee on Telegraphy and Telephony (CCITT) specifications.

21. The method of claim 14 wherein the VLC is encoded according to Joint Photographer's Experts Group (JPEG) specifications.

22. The method of claim 14 wherein the X bits comprise the X most significant bits of the VLC.

23. The method of claim 14 wherein the Y bits comprise the Y least significant bits of the VLC.

24. The method of claim 15 wherein the Z bits comprise the Z least significant bits of the VLC.

25. In a data processing system, a method of decoding a codeword which is part of an encoded bitstream in said data processing apparatus comprising the following steps:

a. retrieving a codeword from said encoded bitstream, said codeword having a first length;

b. applying the codeword to a first lookup table, the first lookup table containing entries associating first combinations of X bits of said codeword with a first set of decoded values, a first entry for a first value of said X bits of said codeword containing a reference to a second lookup table, said second lookup table containing entries associating combinations of Y bits of said codeword with a second set of decoded values, said X and Y bits comprising different portions of said codeword, and X and Y being less than said first length and representing different portions of said codeword; and c. if said X bits of said codeword are equal to said first value then retrieving said first entry, applying said Y bits of said codeword to said second lookup table, and retrieving a second decoded value from said lookup table, otherwise retrieving a first decoded value from said first lookup table.

26. The method of claim 25 wherein said second lookup table further comprises a second entry for a second value of said Y bits of said codeword containing a reference to a third lookup table, said third lookup table containing entries associating combinations of Z bits of said codeword with a third set of decoded values, said Z bits comprising different portions of said codeword than said X and Y bits, Z being less than said first length, said process further comprising the additional step of determining if said Y bits of said codeword are equal to said second value then retrieving said second entry, applying said Z bits of said codeword to said third lookup table, and retrieving a third decoded value from said third lookup table.

* * * * *